(12) United States Patent
Chen et al.

(10) Patent No.: US 7,795,683 B2
(45) Date of Patent: Sep. 14, 2010

(54) THIN FILM TRANSISTOR STRUCTURE

(75) Inventors: Chi-Lin Chen, Hsinchu (TW);
Yu-Cheng Chen, Taipei County (TW);
Hsing-Hua Wu, Kaohsiung (TW);
Po-Tsun Liu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 317 days.

(21) Appl. No.: 11/561,898

(22) Filed: Nov. 21, 2006

(65) Prior Publication Data

US 2007/0210310 A1 Sep. 13, 2007

(30) Foreign Application Priority Data

Mar. 7, 2006 (TW) ............................... 95107552 A

(51) Int. Cl.
*H01L 29/04* (2006.01)

(52) U.S. Cl. .......................... 257/353; 257/59; 257/354

(58) Field of Classification Search ................ 257/353, 257/354, 524, 623, E27.111, E27.112, E27.113, 257/240, 141
See application file for complete search history.

(56) References Cited

U.S. PATENT DOCUMENTS 6,300,649 B1 * 10/2001 Hu et al. ........................ 257/69
2006/0172469 A1 * 8/2006 Lin et al. ..................... 438/149

* cited by examiner

*Primary Examiner*—Howard Weiss
*Assistant Examiner*—Tifney L Skyles
(74) *Attorney, Agent, or Firm*—Jianq Chyun IP Office

(57) ABSTRACT

A structure of a thin film transistor and a method for making the same are provided. The structure includes a strip-shaped silicon island, a gate, and a first and second ion doping regions. The strip-shaped silicon island is a thin film region with a predetermined long side and short side, and farther has a plurality of lateral grain boundaries substantially parallel to the short side of the silicon island. The gate is located over the silicon island and substantially parallel to the lateral grain boundaries. The first and second ion doping regions, used as source/drain regions of the TFT, are located at two sides along the long side of the island and substantially perpendicular to the gate.

9 Claims, 3 Drawing Sheets

THIN FILM TRANSISTOR STRUCTURE

CROSS-REFERENCE TO RELATED APPLICATION

This application claims the priority benefit of Taiwan application serial no. 95107552, filed Mar. 7, 2006. All disclosure of the Taiwan application is incorporated herein by reference.

BACKGROUND OF THE INVENTION

1. Field of Invention

The present invention relates to a thin film transistor structure. More particularly, the present invention relates to an arrangement of a gate structure of a thin film transistor.

2. Description of Related Art

One of various techniques for fabricating thin film transistors is a lateral grain growth technique named heat retaining layer enhanced crystallization (HREC). FIG. 1 is a schematic cross-sectional view of the technique. As shown in FIG. 1, a strip-shaped amorphous silicon island pattern 102 is formed on a substrate 100, and a heat retaining layer (HRL) 104 is then formed thereon. Thereafter, the strip-shaped amorphous silicon island layer is subjected to a laser annealing procedure, such that the strip-shaped amorphous silicon island layer is melted and induced to produce a super lateral grain grown crystalline silicon. The method takes the advantage of the characteristic that the HRL is capable of partially absorbing a particular laser spectrum. Thus, after a part of laser energy is absorbed by the HRL, a continuous supplementary heating effect is exerted on the amorphous silicon, thereby facilitating reducing the cooling speed of the melted silicon during laser crystallization. Accordingly, a longer lateral grain growth is achieved.

FIG. 2 is a top view of a thin film transistor (TFT) fabricated by the conventional definition. First, a silicon island 10 is formed by using the aforementioned manner. As shown in FIG. 2, the crystalline silicon island formed through laser annealing has a longitudinal primary grain boundary P in the middle, and secondary grain boundaries, also referred to as a lateral grain boundary, being substantially perpendicular to the longitudinal primary grain boundary P. During the fabrication of the transistor, the electric current is designed to flow in a direction parallel to the grain boundary in order to make the current flowing smoothly. Therefore, as shown in FIG. 2, a gate 20 is located over the longitudinal primary grain boundary P, while source/drain regions 24 are located at the left and right sides of the primary grain boundary P. In addition, a gate contact 22 is further electrically connected to the gate 20. With this structure, after the transistor is turned on, the current I flows in a direction parallel to the grain boundary, and is only blocked by the primary grain boundary P in the midway. As such, high carrier mobility and superior device quality can be obtained.

Although such a design can provide better device properties, the active region of the amorphous silicon must be patterned first in the technique of using the heat retaining layer enhanced crystallization (H-REC) to obtain the lateral grown polysilicon. The width W of the amorphous silicon island is limited to be greater than the channel length L due to the above step, such that the direction of the lateral grain growth is parallel to the direction of the current flow, and high carrier mobility and control of the grain position can be obtained. In other words, the conventional method of defining the channel length L by a gate region and defining the channel width W by the dimension of the active region limits the device dimension, i.e., the width is larger than the length. Therefore, the device dimension has only few variations in circuit design.

In summary, the TFT manufactured by the conventional technique described above is limited to that the width W thereof must be larger than the channel length L, which results in low design freedom of device dimensions. Furthermore, if the width of the channel region of component is intended to be smaller than the length, an additional mask and photolithography process must be added. Thus, the process cost is increased due to the expensive mask and the complex process procedures.

Accordingly, it has become an urgent matter, under the current grain growth method, how to enhance the design freedom of device dimension so as to increase the adaptability, and how to change the device dimension without adding additional masks so as to reduce the process cost.

SUMMARY OF THE INVENTION

In view of the above, an object of the present invention is to provide a TFT structure and a method of fabricating the same, for increasing the design freedom of the device dimension without increasing the manufacturing cost.

Another object of the present invention is to provide a TFT structure and a method of fabricating the same, for improving the low yield due to drift caused by the photolithographic and etching process, so that the process tolerance is enhanced and thereby the yield is increased.

Still another object of the present invention is to provide a TFT structure and a method of fabricating the same, for increasing the design freedom of the device dimension without increasing the manufacturing cost, and further enhancing the device reliability.

In order to achieve the above objects, the present invention provides a thin film transistor (TFT) structure, which includes a strip-shaped silicon island, a gate, a first ion doping region and a second ion doping region. The strip-shaped island is a thin film region with a predetermined long side and short side, and has a plurality of lateral grain boundaries substantially parallel to the direction of the short side of the silicon island. The gate is located over the longitudinal silicon island and substantially parallel to the lateral grain boundaries. The first and the second ion doping regions, used as a source and a drain regions of the TFT, are located at two sides along the long side of the strip-shaped silicon island and substantially perpendicular to the gate.

In the TFT structure described above, the strip-shaped silicon island can be, for example, a polysilicon island. The polysilicon island can further include a primary grain boundary located at the center of the strip-shaped silicon island and is substantially perpendicular to the plurality of lateral grain boundaries. The long side of the gate is substantially perpendicular to the primary grain boundary.

According to an embodiment of the present invention, the aforementioned TFT structure can be formed as a dual-gate structure. That is, the aforementioned TFT structure can further include a third ion doping region located in the strip-shaped silicon island and below the gate, and the third ion doping region is substantially parallel to the first and second ion doping regions. In addition, the third ion doping region can be substantially located at a position consistent with the primary grain boundary.

According to an embodiment of the present invention, in order to further enhance the reliability of the TFT, the first and second ion doping regions are respectively located on a portion of both sides of the strip-shaped silicon island, and the first and the second ion doping region are misaligned with each other.

According to an embodiment of the present invention, the TFT structure can further include a gate contact, a source contact and a drain contact, which are respectively connected to the gate, the first ion doping region and the second ion doping region.

Additionally, the present invention also provides a method of fabricating a TFT. A strip-shaped silicon island is provided, which is a thin film region with a predetermined long side and short side, or further has a plurality of lateral grain boundaries substantially parallel to the short side. Then the strip-shaped silicon island is subjected to an ion implantation to form a first ion doping region and a second ion doping region. The first and second ion doping regions, respectively used as the source and the drain of the TFT, are located at two sides along the long side of the island and substantially perpendicular to the gate. A gate is formed over the strip-shaped silicon island and the first and second ion doping regions, and the gate is substantially parallel to the lateral grain boundaries.

According to an embodiment of the present invention, the strip-shaped silicon island can further includes a primary grain boundary, and the primary grain boundary is located at the center of the longitudinal silicon island and is substantially perpendicular to the plurality grain boundaries. When using a polysilicon thin film, the direction of the long side of the gate is substantially perpendicular to the primary grain boundary.

The aforementioned method of fabricating a TFT can further include forming a third ion doping region located in the strip-shaped silicon island and below the gate, in which the third ion doping region is substantially parallel to the first and second ion doping regions. The third ion doping region can be substantially formed at a position consistent with the primary grain boundary.

In the aforementioned method of fabricating a TFT, the first and second ion doping regions are respectively formed on a portion of both sides of the strip-shaped silicon island, and the first and second ion doping regions are misaligned with each other.

The aforementioned method of fabricating a TFT can further comprise forming a gate contact, a source contact and a drain contact respectively electrically connected to the gate, the first ion doping region and the second ion doping region.

With the TFT structure and the method of fabricating the same described above, a problem existing in the conventional crystallization technique that an active region must be patterned in advance for the crystallization and an additional mask must be added to etch the device so as to satisfy the requirement for the device having a length greater than the width, is thus solved. Therefore, the present invention utilizes the arrangement of the gate to define the channel width of the components, and the size of the active region (the strip-shaped silicon island) is the channel length of the device. Accordingly, the limitations to the device dimension can be eliminated without increasing the number of the masks in the process, thus the number of the masks can be saved and the variability and reliability of the device designs can also be enhanced.

In order to the make the aforementioned and other objects, features and advantages of the present invention comprehensible, a preferred embodiment accompanied with figures is described in detail below.

DESCRIPTION OF EMBODIMENTS

The concept of the present invention is to redefine and design the arrangement of the gate to allow the design of device dimension to have larger freedom.

Figure 3:
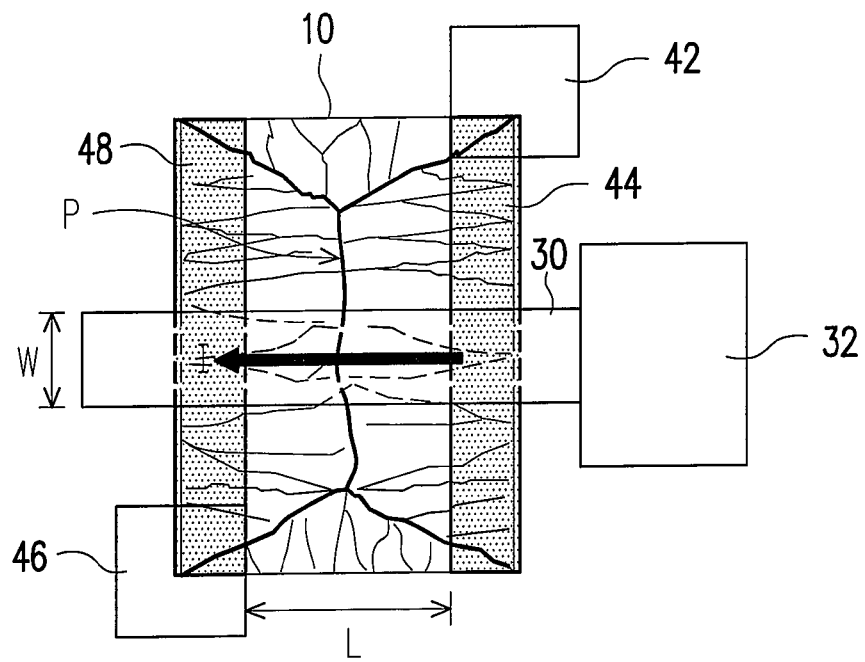
FIG. 3 is a top view of a transistor according to an embodiment of the present invention.

FIG. 3 is a top view of a transistor according to an embodiment of the present invention. First, a strip-shaped silicon island 10 is formed in the manner described above. As shown in FIG. 3, the strip-shaped silicon island formed by laser annealing is a thin film region with predetermined long side and short side. The strip-shaped silicon island 10 can be a polysilicon island, and the polysilicon island 10 is used as an example below. The polysilicon island 10 has a longitudinal primary grain boundary P at the center and lateral grain boundaries also named secondary grain boundaries substantially perpendicular to the longitudinal primary grain boundary P. The steps above are the same as those in the conventional art.

Thereafter, a gate 30 is formed over the primary grain boundary P and has the long side substantially perpendicular to the primary grain boundary P. A gate contact 32 is electrically connected to the gate 30 and located at one end of the gate 30 to provide a control signal to the gate 30 for controlling the on/off of the transistor.

The ion doping regions 44, 48, used as the source/drain regions of the transistor, are respectively located at two sides of the silicon island 10, i.e., two sides of the primary grain boundary P, and are respectively electrically connected to the source and drain contacts 42, 46.

With the structure as shown in FIG. 3, when the transistor is turned on, the current remains in the direction substantially parallel to the grain boundaries, and is only blocked by the primary grain boundary P in the midway. However, since the location of the gate 30 is revolved by 90 degrees, i.e., substantially perpendicular to the extension of the primary grain boundary P, the length L of channel region below the gate 30 and between the source and drain regions 44, 48 becomes larger than the width W.

Therefore, it is apparent from the above embodiment that by readjusting the location of the gate 30, a structure with the length L of channel region larger than the width W can be obtained according to the present invention without limitation of the conventional structure that the width W must be larger than the length L. Namely, in the present invention, the location of the gate 30 and the short side of the gate are used to define the effective width W of the channel region of the component, and the size of the silicon island 10 and the pitch between the ion doping regions 44, 48 are used to define the effective length L of the channel region of component. With the defining method, the device dimension is increased and the variability of the circuit design is enhanced. Additionally, in this structure an additional mask is not necessary for redefining the width and length of the channel region, thus reducing the overall manufacturing cost.

Figure 1:
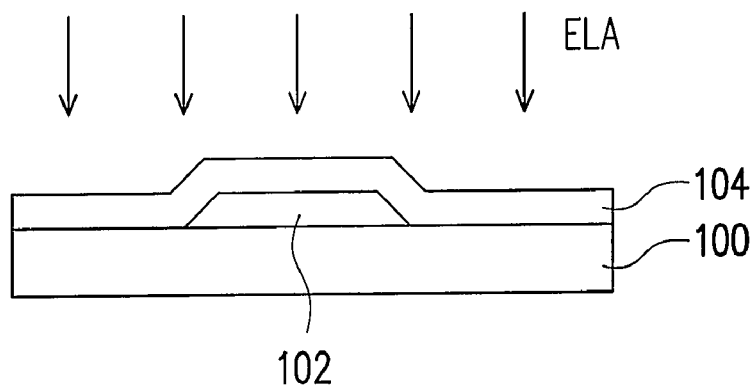
FIG. 1 is a schematic view of the crystallization of silicon grown by using the heat retaining layer.
Figure 2:
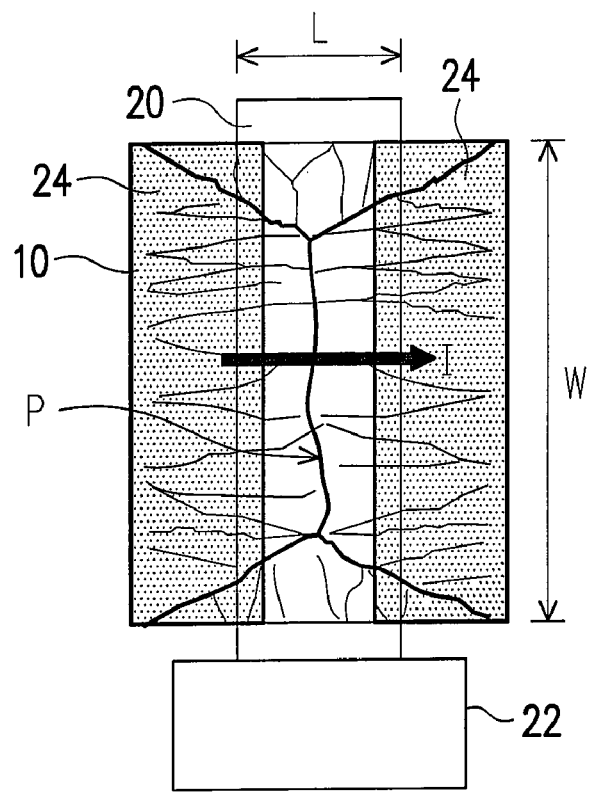
FIG. 2 is a top view of a transistor of the conventional art.

In addition, according to the structure provided by the present invention, errors of photolithographic draft and pattern shift can be reduced, making it feasible to fabricate devices on a flexible substrate. Description is made hereafter with the comparison between FIG. 2 and FIG. 3. In the conventional structure as shown in FIG. 2, a gate 20 is located along the extension of the primary grain boundary P, and the source/drain regions 24 are located at two sides of the gate 20. The region covered by the gate is the channel region. During the patterning, the gate 20 cannot cover the source/drain regions 24 if a position shifting of the gate 20 exists, such that the channel region contains intrinsic polysilicon with high impedance. Hence, the gate must be precisely patterned according to the conventional structure. On the contrary, according to the structure of the present invention shown in FIG. 3, even though a position shifting occurs during patterning the gate 30 and the gate 30 is shifted upward or downward, the final gate structure 30 is still across the source and drain regions 44 and 48, without affecting the portion of channel region. Therefore, the transistor structure of the present invention can improve the yield.

Figure 4:
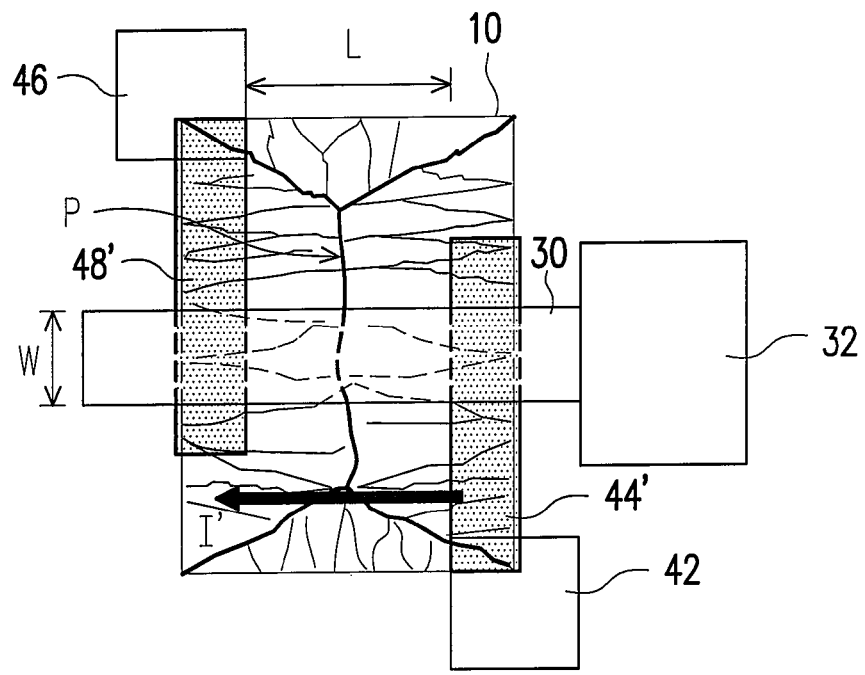
FIG. 4 is a top view of a variation of the transistor in FIG. 3.

FIG. 4 is a top view of a variation of the transistor as shown in FIG. 3. The difference between the structures of FIG. 4 and FIG. 3 lies in that the ion doping regions 44' and 48' of the source and drain regions in FIG. 4 are respectively only formed on a portion of both sides of the silicon island 10 instead of the region of whole sides. The source/drain doping regions 44' and 48' are respectively located on a portion of the two sides of the polysilicon island 10 and are misaligned with each other. The structure and the dimension characteristics (the width and length of the channel) in FIG. 4 are essentially the same as those in FIG. 3, and the difference lies in the sizes of the source/drain doping regions.

With the structure of FIG. 3, a leakage current for example I' shown in FIG. 4 might occur in some circumstance. However, with the structure of FIG. 4, the current leakage can be prevented because the source/drain doping region 48' on the left of FIG. 4 is not doped on the whole left side of the silicon island 10. Similarly, only a portion of the right side region of the silicon island 10 in FIG. 4 forms the source/drain doping region 44'. With the structure, the source/drain doping region away from the gate 30 is formed on one side of the silicon island 10, so the occurrence of current leakage is further reduced.

Figure 5:
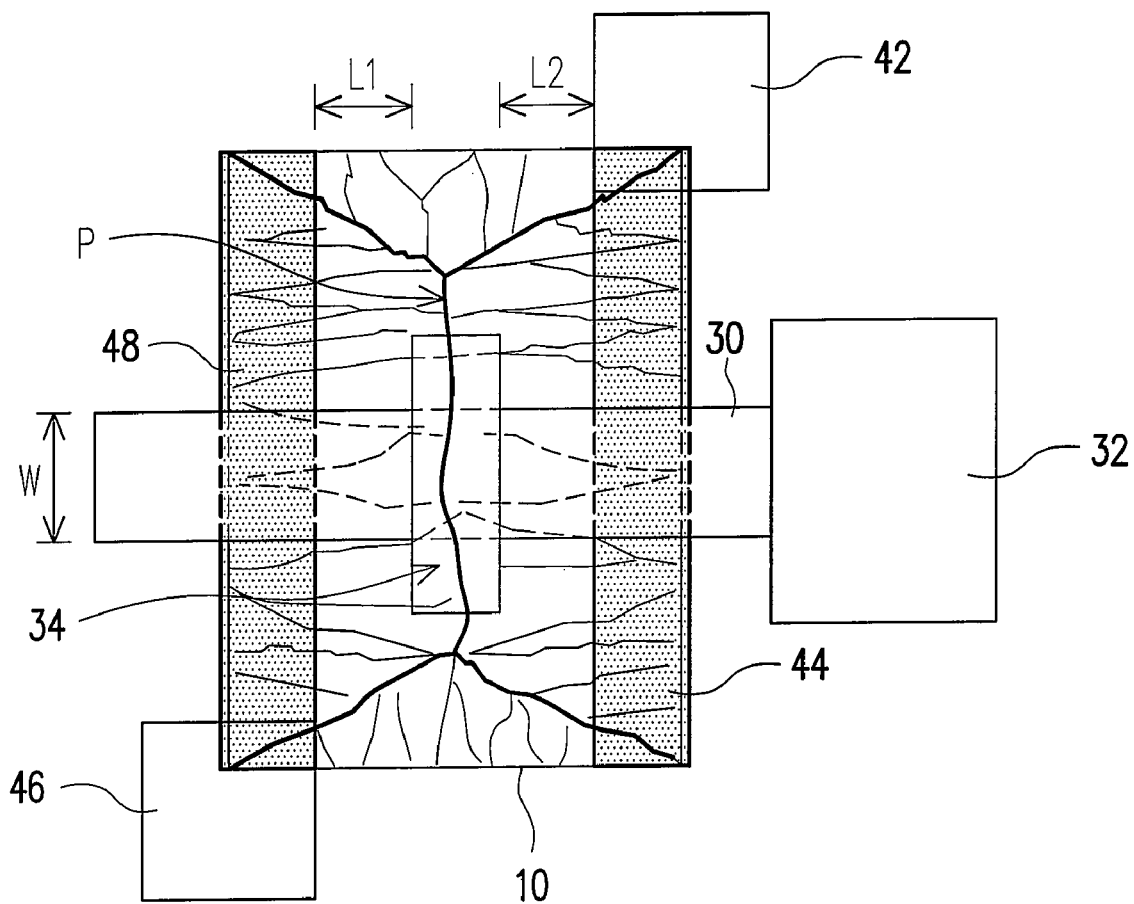
FIG. 5 is a top view of a transistor according to another embodiment of the present invention.

FIG. 5 is a top view of a transistor according to another embodiment of the present invention. FIG. 5 shows a design structure of forming a so-called dual-gate device by adding a doping region. As shown in FIG. 5, one doping region 34 is further formed over the primary grain boundary P of the poly-silicon 10, serving as the third source/drain doping region. A dual-gate device structure is formed accompanied with the gate region 30 above. The L1 and L2 in FIG. 5 respectively indicate two effective channel lengths.

With the structure described above, since the current flowing through the channel region completely passes the grain boundary only without being blocked by the primary grain boundary P after the transistor is turned on, the device reliability is further enhanced. A modification of the structure in FIG. 3 is illustrated in FIG. 5, which becomes a dual-gate structure. Also, the device in FIG. 4 can be modified to a dual-gate structure in the same manner. The corresponding drawing can be derived for those skilled in the art based on the modification in FIG. 5, and will not be provided herein.

Furthermore, although the HRC technique is employed to fabricate the polysilicon thin films in the above embodiment, the present invention is not limited thereto. For example, the device structure provided by the present invention, i.e., the rearrangement of the gate, can also be applied to the lateral grain growth mechanism. During the grain growth, the lateral grain growth mechanism does not first form a primary grain boundary P at the middle, but the grain are laterally grown from one side of the pre-patterned amorphous silicon island to the other, such that the crystalline orientation of the polysilicon island finally assumes a lateral grain boundary. When the present invention is implemented, the long side of the gate is only disposed along the crystalline orientation.

In view of the above, the limitation that the short side of the silicon island must be smaller than the long side to generate a crystallization in which the lateral grain growth direction is parallel to the current direction can be eliminated by changing the arrangement of the gate and using a new definition to define the width and length of the channel. Further, the width of the channel can be made smaller than the length without adding additional masks, thus reducing the manufacturing cost and number of masks. Since the position of the gate is changed, the problem resulting from the shift of the photolithographic process in the conventional structure is reduced.

Therefore, the present invention employs a novel arrangement manner of the gate and define manner of the device dimension, and uses the original number of masks and the arrangement of the gate. In this manner, the limitation to the device dimension is eliminated, and thereby the application of the technique is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor structure, comprising:
    a strip-shaped silicon island, having a thin film region with a predetermined short side and long side, wherein the strip-shaped silicon island has a plurality of lateral grain boundaries substantially parallel to the direction of the short side;
    a gate, located over the strip-shaped silicon island and parallel to the short side of the island, wherein a long side of the gate is substantially parallel to the lateral grain boundaries; and
    a first and second ion doping regions, used as a source and a drain of the thin film transistor, located at two sides along the long side of the strip-shaped silicon island and being substantially perpendicular to the gate.

2. The thin film transistor structure as claimed in claim 1, wherein the strip-shaped silicon island is a polysilicon island.

3. The thin film transistor structure as claimed in claim 2, wherein the strip-shaped silicon island further comprises a primary grain boundary located at the center of the strip-shaped silicon island and substantially perpendicular to the plurality of lateral grain boundaries.

4. The thin film transistor structure as claimed in claim 3, wherein the direction of the long side of the gate is substantially perpendicular to the primary grain boundary.

5. The thin film transistor structure as claimed in claim 1, further comprising a third ion doping region located in the strip-shaped silicon island and below the gate, and being substantially parallel to the first and second ion doping regions.

6. The thin film transistor structure as claimed in claim 3, further comprising a third ion doping region located in the strip-shaped silicon island and below the gate, and being substantially parallel to the first and second ion doping regions.

7. The thin film transistor structure as claimed in claim 6, wherein the third ion doping region is located in a position substantially consistent with the primary grain boundary.

8. The thin film transistor structure as claimed in claim 1, further comprising a gate contact, a source contact and a drain contact, respectively electrically connected to the gate, the first ion doping region and the second ion doping region.

9. The thin film transistor structure as claimed in claim 1, wherein the long side of the gate is substantially along a longitudinal direction of the gate.

* * * * *